(12) United States Patent
Yamamoto et al.

(10) Patent No.: US 8,387,630 B2
(45) Date of Patent: Mar. 5, 2013

(54) PROTECTIVE FILM REMOVING DEVICE, MIXED CHEMICAL SOLUTION RECOVERING METHOD AND PROGRAM STORAGE MEDIUM

(75) Inventors: Taro Yamamoto, Koshi (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1340 days.

(21) Appl. No.: 11/681,977

(22) Filed: Mar. 5, 2007

(65) Prior Publication Data
US 2007/0215178 A1 Sep. 20, 2007

(30) Foreign Application Priority Data

Mar. 14, 2006 (JP) .................. 2006-069664

(51) Int. Cl.
*B08B 3/04* (2006.01)
(52) U.S. Cl. .................... 134/104.2; 134/902
(58) Field of Classification Search .............. 134/1.3, 134/10, 104.2, 104.4, 109, 111, 902
See application file for complete search history.

(56) References Cited

U.S. PATENT DOCUMENTS

| | | | | |
|---|---|---|---|---|
| 3,554,906 | A * | 1/1971 | Wolf .............................. | 210/649 |
| 4,955,403 | A * | 9/1990 | Zappa et al. .................. | 134/109 |
| 5,511,569 | A * | 4/1996 | Mukogawa ................. | 134/104.1 |
| 2003/0008066 | A1* | 1/2003 | Yoshihara et al. ............ | 427/240 |

FOREIGN PATENT DOCUMENTS

| | | |
|---|---|---|
| JP | 7-11470 | 1/1995 |
| JP | 8-173921 | 7/1996 |
| JP | 2005-175079 | 6/2005 |
| JP | 2005-183709 | 7/2005 |

OTHER PUBLICATIONS

Machine Translation of Yamamoto et al. JP 2005-183709, Jul. 2005.*

* cited by examiner

*Primary Examiner* — Michael Barr
*Assistant Examiner* — David Cormier
(74) *Attorney, Agent, or Firm* — Oblon, Spivak, McClelland, Maier & Neustadt, L.L.P.

(57) ABSTRACT

The present invention improves recover percentage at which a mixed chemical solution discharged from a protective film removing device.
The protective film removing device includes: a recovery line communicating with an atmosphere surrounding a substrate to recover a mixed chemical solution, an intermediate tank connected to the outlet end of the recovery line, a volatilization preventing liquid supply means for supplying a volatilization preventing liquid having a specific gravity smaller than that of the mixed chemical solution into the intermediate tank in advance, a transfer line having an inlet end connected to the intermediate tank and provided with a valve, a recovery tank connected to an outlet end of the transfer line, a liquid quantity monitoring means for monitoring a quantity of a liquid contained in the intermediate tank, and a control means for opening the valve of the transfer line to transfer the liquid contained in the intermediate tank to the recovery tank when it is decided that the quantity of the liquid contained in the intermediate tank reached a predetermined quantity on the basis of a signal provided by the liquid quantity monitoring means.

12 Claims, 12 Drawing Sheets

PROTECTIVE FILM REMOVING DEVICE, MIXED CHEMICAL SOLUTION RECOVERING METHOD AND PROGRAM STORAGE MEDIUM

BACKGROUND OF THE INVENTION

1. Field of the Invention

The present invention relates to a protective film removing device for removing a water-repellent protective film formed on a surface of a substrate by dissolving the water-repellent protective film in a liquid remover and recovering a mixed chemical solution, which is a mixture of the liquid remover and a solution produced by dissolving the water-repellent protective film in the liquid remover, and a method of recovering the mixed chemical solution.

2. Description of the Related Art

A photolithographic technique for a semiconductor device fabricating process includes, for example, the steps of forming a resist film on a semiconductor wafer (hereinafter, referred to simply as "wafer") exposing the resist film to light through a photomask, and developing the exposed resist film by a developing process to form a desired resist pattern.

An exposure technique disclosed in JP-A 2005-175079 forms a liquid layer that transmits light on a surface of a wafer and exposes the wafer through the liquid layer. Hereinafter, this exposure technique will be referred to as an immersion exposure method. The immersion exposure method uses a characteristic nature of light that the wavelength of light reduces when light travels in a liquid layer, such as a pure water layer. For example, the wavelength of 193 nm of light emitted by an ArF light source decreases to 134 nm in water. Thus a high-resolution exposure process can be achieved by using an existing argon fluoride light source (ArF light source) or an existing krypton fluoride light source (KrF light sources).

Studies have been made to suppress the elution of the resist during immersion exposure and to make a liquid layer used for immersion exposure on a surface of a wafer difficult to remain on the surface of the wafer by forming a water-repellent protective film on the surface of the wafer after coating the surface with a liquid resist. A technique mentioned in JP-A 2005-183709 removes a water-repellent protective film formed on a surface of a wafer with a chemical solution (remover) in a developing system, and recovers the used chemical solution. A diluted developer or a thinner is used as the chemical solution to remove a protective film soluble in an alkaline solution. A fluorocarbon solvent or the like us used as the chemical solution to remove a protective film insoluble in an alkaline solution.

Abilities and costs of protective films will be examined. The latter protective film insoluble in an alkaline solution is superior in ability to the former protective film soluble in an alkaline solution. However, the latter protective film is more costly than the former protective film. The protective film insoluble in an alkaline solution is a film of a fluorocarbon resin. A fluorocarbon solvent is used as remover for removing the protective film of a fluorocarbon resin. The protective film of a fluorocarbon resin and the fluorocarbon solvent are costly. The inventors of the present invention made studies to recover a mixed chemical solution containing the remover and the solution produced by dissolving the protective film in the remover to recycle those chemicals. Since those chemicals are highly volatile, the recovery percentage of those chemicals is very small. The recovery percentage is between several percent and about 50% for a 300 mm diameter wafer.

A method of preventing the natural gasification (volatilization) of a highly volatile cleaning solvent, such as PFC (perfluorocarbon), HCFC, HFC or the like, mentioned in JP-A 2005-175079 forms an oil film over the surface of a cleaning solvent contained in a cleaning tank by discharging an oil having a specific gravity smaller than that of the cleaning solvent by an oil discharging device toward the surface of the cleaning solvent contained in the cleaning tank to form an oil film over the surface of the cleaning solvent to prevent the volatilization of the cleaning solvent. However, nothing about a method of solving the foregoing problem is mentioned in JP-A 2005-175079.

SUMMARY OF THE INVENTION

The present invention has been made under such circumstances and it is therefore an object of the present invention to provide a mixed chemical solution recovering method capable of recovering a mixed chemical solution containing a remover for removing a water-repellent protective film formed on a surface of a substrate, and a chemical solution containing the remover and the water-repellent protective film dissolved in the remover at a high recovery percentage.

A protective film removing device according to the present invention that pours a remover, such as a fluorocarbon solvent, through a remover pouring nozzle onto a surface of a substrate horizontally held by a substrate holding device to remove a water-repellent protective film formed on a surface of a resist film formed on the substrate before subjecting the resist film to immersion exposure by dissolving the water-repellent protective film in the remover after immersion exposure includes:

a recovery line communicating with an atmosphere surrounding the substrate to recover a mixed chemical solution containing the remover, and a chemical solution containing the remover and the water-repellent protective film dissolved in the remover;

an intermediate tank connected to an outlet end of the recovery line;

a volatilization preventing liquid supply means for supplying a volatilization preventing liquid having a specific gravity smaller than that of the mixed chemical solution in advance into the intermediate tank;

a transfer line having an inlet end connected to the intermediate tank and provided with a valve;

a recovery tank connected to an outlet end of the transfer line;

a liquid quantity monitoring means for monitoring the quantity of a liquid contained in the intermediate tank; and a control means for opening the valve of the transfer line to transfer the liquid contained in the intermediate tank to the recovery tank when it is decided that the quantity of the liquid contained in the intermediate tank reached a predetermined quantity on the basis of a signal provided by the liquid quantity monitoring means.

In the protective film removing device according to the present invention, the intermediate tank may include a first intermediate tank and a second intermediate tank, the recovery line may be branched into branch lines respectively having outlet ends connected to the first and the second intermediate tank, respectively, and the control means may have a function to control the valve of the recovery line, when it is decided that the quantity of the liquid contained in either of the first and the second intermediate tank has reached the predetermined quantity, to make the recovery line receive the liquid from the other of the first and the second intermediate tank. The control means opens the valve of the transfer line connected to the intermediate tank when the quantity of the liquid contained in the intermediate tank reaches the predetermined quantity to send the liquid from the intermediate tank to the recovery tank.

In the protective film removing device according to the present invention, the recovery tank may include a first recovery tank and a second recovery tank connected to the outlet end of the transfer line, and the control means may have a function to control the valve of the transfer line, when it is decided that the quantity of the liquid contained in either of the first and the second recovery tank has reached a predetermined quantity, so as to transfer the liquid through the transfer line to the other of the first and the second recovery tank.

In the protective film removing device according to the present invention, it is preferable to transfer the volatilization preventing liquid together with the liquid contained in the intermediate tank to the recovery tank when the valve of the transfer line is opened. When the volatilization preventing liquid contained in the intermediate tank is not transferred to the recovery tank, the recovery tank may be provided with a volatilization preventing liquid supply means.

The protective film removing device according to the present invention may include a liquid change sensing means capable of sensing a change of the liquid being transferred from the intermediate tank to the recovery tank from the mixed chemical solution to the volatilization preventing liquid, and the control means may close the valve of the transfer line when a change of the liquid from the mixed chemical solution to the volatilization preventing liquid is sensed by the liquid change sensing means. The protective film removing device according to the present invention may include a drain line for draining the liquid contained in the intermediate tank, and a valve placed in the drain line, and the control means may have a function to open the valve of the drain line when a change of the liquid from the mixed chemical solution to the volatilization preventing liquid is sensed by the liquid change sensing means in addition to a function to close the valve of the transfer line.

The protective film removing device according to the present invention may include a return line for returning the liquid contained in the intermediate tank into the recovery line, a valve placed in the return line, and a return tank connected to the return line to contain the volatilization preventing liquid, and the control means may have a function to open the valve of the return line to transfer the volatilization preventing liquid to the return tank in addition to a function to close the valve of the transfer line when a change of the liquid from the mixed chemical solution to the volatilization preventing liquid is sensed by the liquid change sensing means.

Another protective film removing device according to the present invention that pours a remover, such as a fluorocarbon solvent, through a remover pouring nozzle onto a surface of a substrate horizontally held by a substrate holding device to remove a water-repellent protective film formed on a surface of a resist film formed on the substrate before subjecting the resist film to immersion exposure by dissolving the water-repellent protective film in the remover after immersion exposure includes:

a recovery line communicating with an atmosphere surrounding the substrate to recover a mixed chemical solution containing the remover, and a chemical solution containing the remover and the water-repellent protective film dissolved in the remover;

a recovery tank connected to the outlet end of the recovery line;

a volatilization preventing liquid supply means for supplying a volatilization preventing liquid having a specific gravity smaller than that of the mixed chemical solution and capable of remaining separate from the mixed chemical solution in advance into the recovery tank;

a liquid quantity monitoring means for monitoring the quantity of a liquid contained in the intermediate tank; and a control means for closing the valve of the recovery line when it is decided that the quantity of the liquid contained in the recovery tank reached a predetermined quantity on the basis of a signal provided by the liquid quantity monitoring means. The recovery tank of this protective film removing device may include a first recovery tank and a second recovery tank, the first and the second recovery tank may be connected to the outlet end of the recovery line, and the control means may have a function to control the valve of the recovery line, when it is decided that the quantity of the liquid contained in either of the first and the second recovery tank has reached the predetermined quantity, so as to make the recovery line receive the liquid from the other of the first and the second recovery tank.

The protective film removing device according to the present invention may be a volatilization preventing liquid supply means for supplying the volatilization preventing liquid into the remover pouring nozzle or may be a volatilization preventing liquid supply means for supplying the volatilization preventing liquid into the recovery line to wash off the mixed chemical solution remaining in the recovery line. The volatilization preventing liquid supply means for supplying the volatilization preventing liquid into the recovery line is a volatilization preventing liquid pouring nozzle for pouring the volatilization preventing liquid onto the surface of the substrate held by the holding device, nozzles for cleaning a peripheral part of the back surface of the substrate, or a volatilization preventing liquid supply line connected to a cup surrounding the substrate holding device and having a bottom to which the recovery line is connected.

A chemical solution recovering method according to the present invention that recovers a mixed chemical solution produced in a protective film removing process for removing a water-repellent protective film formed on a resist film formed on a surface of a substrate before subjecting the resist film to immersion exposure after immersion exposure by dissolving the water-repellent protective film in a remover, and containing the remover, and a chemical solution of the remover and the water-repellent protective film dissolved in the remover includes the steps of:

storing a volatilization preventing liquid having a specific gravity smaller than that of the mixed chemical solution and capable of remaining separate from the mixed chemical solution in an intermediate tank in advance;

sending the mixed chemical solution to the intermediate tank;

monitoring the quantity of a liquid contained in the intermediate tank; and transferring the mixed chemical solution and the volatilization preventing liquid from the intermediate tank to a recovery tank by opening a valve placed in a transfer line connecting the intermediate tank to the recovery tank when it is decided that the quantity of the liquid contained in the intermediate tank has reached a predetermined quantity.

A storage medium according to the present invention storing a program to be executed by a computer to control a protective film removing device that pours a remover, such as a fluorocarbon solvent, through a remover pouring nozzle onto a surface of a substrate horizontally held by a substrate holding device to remove a water-repellent protective film formed on a surface of a resist film formed on the substrate before subjecting the resist film to immersion exposure by dissolving the water-repellent protective film in the remover after immersion exposure, wherein the program includes instructions for accomplishing the steps of the chemical solution recovering method according to the present invention. When the water-repellent protective film formed on the surface of the substrate is wetted with the remover, such as a fluorocarbon solvent, the water-repellent protective film peels off the surface of the substrate. Therefore, the remover is also called a stripper.

According to the present invention, the mixed chemical solution of the remover, and the chemical solution containing the remover and the protective film dissolved in the remover is stored temporarily in the intermediate tank in a state where the mixed chemical solution is prevented from volatilizing by the volatilization preventing liquid, and the mixed chemical solution is transferred to the recovery tank after the quantity of the liquid including the mixed chemical solution and the volatilization preventing liquid has reached a predetermined quantity. Thus the mixed chemical solution can be recovered at a high recovery percentage, and the expensive remover can be recycled.

The chemical solution recovering method that stores the mixed chemical solution temporarily in the intermediate tank, as compared with a method that stores the mixed chemical solution directly in the recovery tank, can reduce work for separating the mixed chemical solution from water when the mixed chemical solution is delivered from the intermediate tank to the least possible extent and can limit the volatilization of the mixed chemical solution to the least possible extent.

DESCRIPTION OF THE PREFERRED EMBODIMENTS

Figure 1:
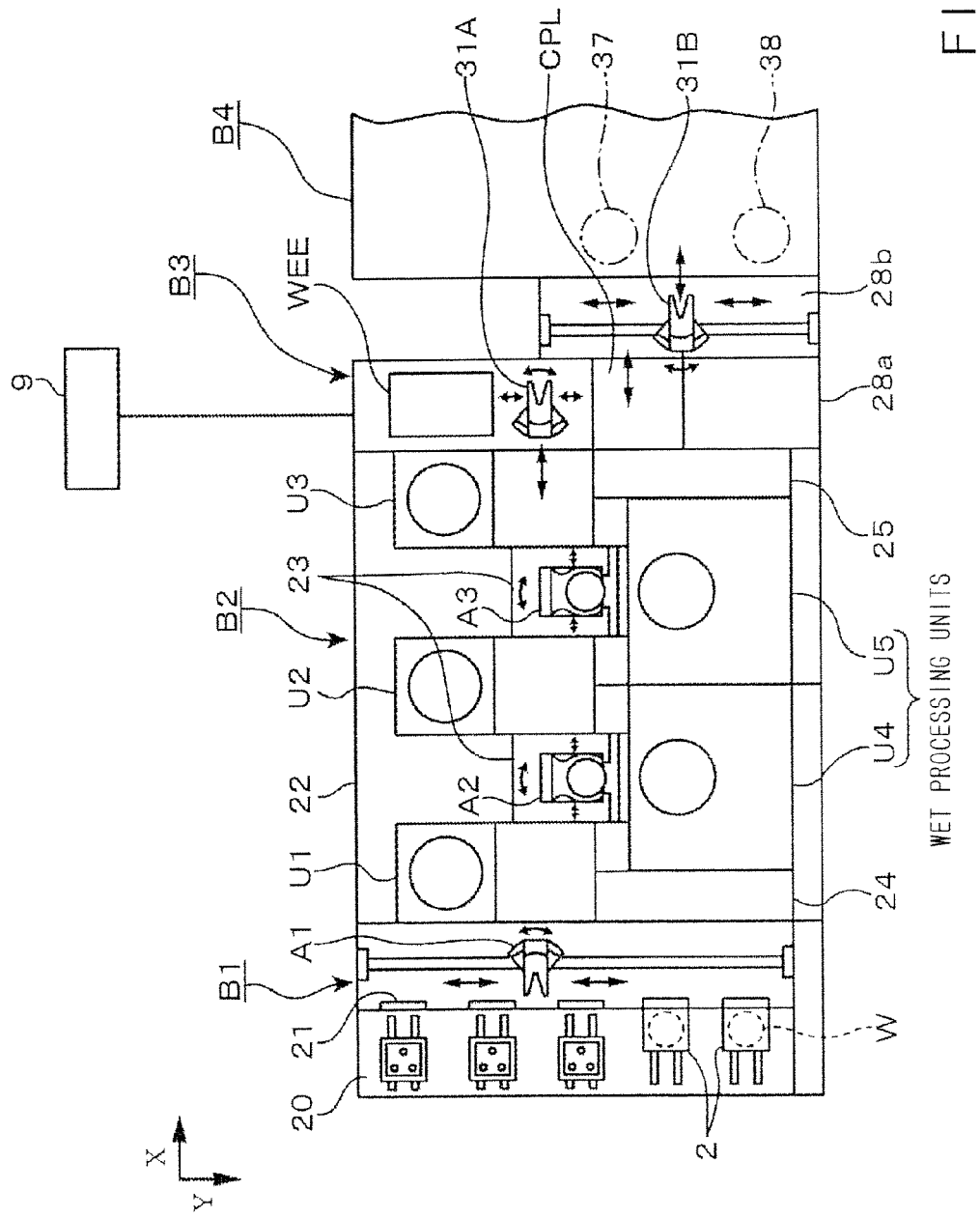
FIG. 1 is a plan view of a coating and developing system in a preferred embodiment according to the present invention.
Figure 2:
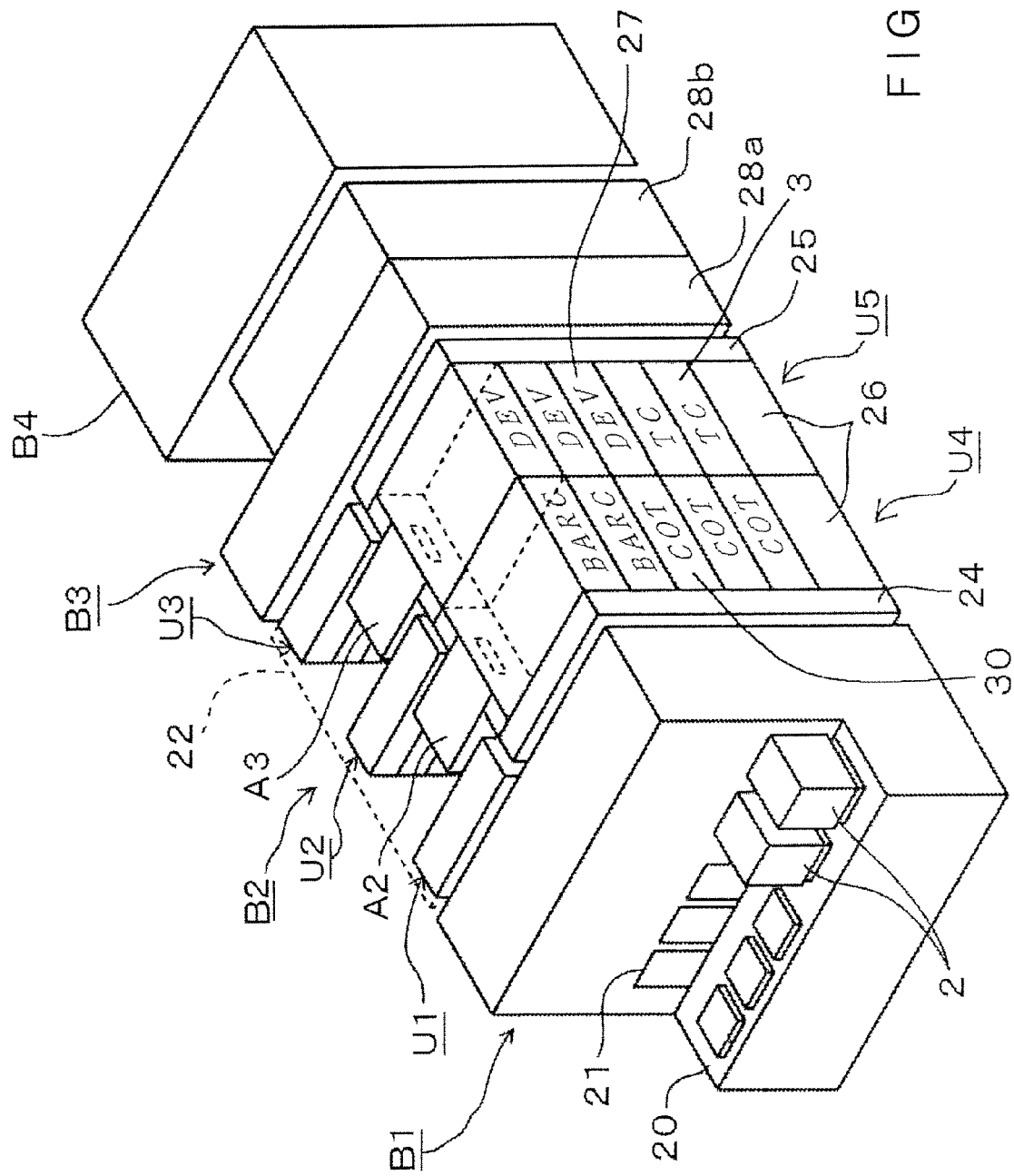
FIG. 2 is a perspective view of the coating and developing system in the preferred embodiment.
Figure 3:
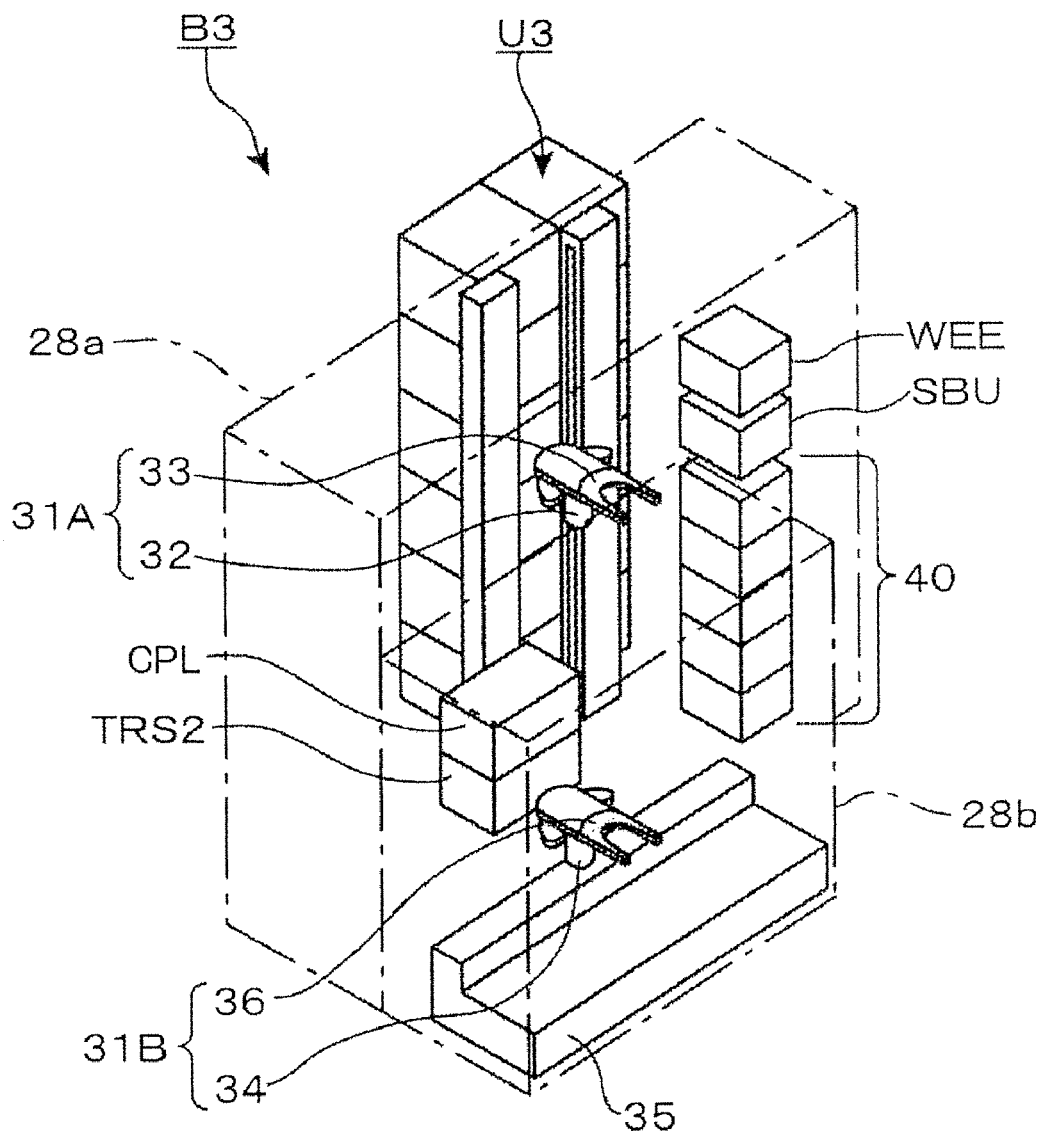
FIG. 3 is a schematic perspective view of an interface block include in the coating and developing system in the preferred embodiment.

A coating and developing system including a protective film removing device in a preferred embodiment according to the present invention and combined with an exposure system will be briefly described prior to the description of the protective film removing device with reference to FIGS. 1 to 3. Referring to FIGS. 1 and 2, a carrier 2 containing, for example, thirteen wafers W, namely, substrates, in an airtight fashion is delivered to a carrier station B1. The carrier station B1 is provided with a stage 20 capable of supporting a plurality of carriers 2 thereon, a wall disposed behind the stage 20 and provided with closable openings 21, and a transfer device A1 for taking out the wafers W from the carrier 2 through the closable opening 21.

A processing block B2 surrounded by a box 22 is disposed behind and joined to the carrier station B1. The processing block B2 includes shelf units U1, U2 and U3 arranged backward in that order, wet processing units U4 and U5, main carrying devices A2 and A3 for transferring a wafer W among the shelf units U1 to U3 and the wet processing units U4 and U5. Each of the shelf units U1, U2 and U3 is built by stacking heating and cooling units in layers. The shelf units U1 to U3 and the main carrying devices A2 and A3 are arranged alternately. The main carrying devices A2 and A3 are disposed in a space 23 defined by the opposite side surfaces of the shelf units U1 and U2, a side surface of the wet processing unit U4 and a rear surface on the left side as viewed from the carrier station B1, and a space 23 defined by the opposite side surfaces of the shelf units U2 and U3, a side surface of the wet processing unit U5 and the rear surface, respectively. In FIGS. 1 and 2, indicated at 24 and 25 are temperature and humidity control units including temperature controllers for controlling the temperature of processing solutions to be used by the units and ducts for air conditioning.

As shown by way of example in FIG. 2, the wet processing unit U4 is built by stacking coating devices 30 (COT) for coating a wafer W with a liquid resist film, and antireflection film forming devices 3 (BARC)in, for example, five layers, and the wet processing unit U5 is built by stacking protective film forming devices 3 (TC) for forming a water-repellent protective film in soluble in an alkaline solution on a wafer W by coating the surface of the wafer W with a coating liquid containing a water-repellent material, such as a fluorocarbon solvent, and developing devices 27 (DEV) for processing a wafer W by a developing process in, for example, five layers. Each of the shelf units U1, U2 and U3 is built by stacking various devices for processing a wafer W by pretreatment processes before the wafer W is processed by the wet processing units U4 and U5 and for processing a wafer W by posttreatment processes after the wafer W has been processed by the wet processing units U4 and U5 in, for example, ten layers. Each of the shelf units U1, U2 and U3 includes heating devices for baking a wafer W and cooling devices for cooling a wafer W.

A developing system B4 is connected to the shelf unit U3 of the processing block B2 by an interface block B3. The interface block B3 will be described with reference to FIGS. 1, 2 and 3. The interface block B3 has a first carrying chamber 28a and a second carrying chamber 28b longitudinally arranged between the processing block B2 and the exposure system B4. A main carrying device 31A and an auxiliary carrying device 31B are placed in the first carrying chamber 28a and the second carrying chamber 28b, respectively. The main carrying device 31A and the auxiliary carrying device 31B are substrate carrying means. The main carrying device 31A includes a base member 32 capable of moving vertically and of turning about a vertical axis, and an arm 33 capable of moving longitudinally on the base member 32. In the first carrying chamber 28a, an edge exposure device WEE for selectively exposing a peripheral part of a wafer W and a buffer cassette SBU capable of temporarily storing, for example, twenty-five wafers W are disposed on the left side, as viewed from the carrier station B1, of the main carrying device 31A. Protective film removing devices 40 for removing a protective film formed on a wafer W are stacked in, for example, four layers under the buffer cassette SBU.

A transfer unit TRS2 is disposed on the right side of the main carrying device 31A. A precision temperature adjusting unit CPL provided with, for example, a cooling plate is disposed under the transfer unit TRS2.

The main carrying device 31A carries a wafer W not yet processed by an exposure process and placed in a transfer unit TRS1 included in the shelf unit U3 sequentially to the edge exposure device WEE, the buffer cassette SBU and the precision temperature adjusting unit CPL. The main carrying device 31A carries the wafer W processed by the exposure process and placed in the transfer unit TRS2 sequentially to the protective film removing device 40 and the heating unit PEB of the shelf unit U3.

The auxiliary carrying device 31B includes a base member 34 capable of moving vertically and of turning about a vertical axis, a guide mechanism 35 for laterally moving the base member 34, and an arm 36 capable of moving longitudinally on the base member 34. The auxiliary carrying device 31B carries the wafer W from the precision temperature adjusting unit CPL to a receiving stage 37 included in the exposure system B4, and carries the wafer W from a delivery stage 38 included in the exposure system B4 to the transfer unit TRS2.

The construction f the protective film removing device 40 will be described with reference to FIGS. 4A and 4B. In FIGS. 4A and 4B, indicated at 50 is a spin chuck, namely, a substrate holding device, for holding a wafer W in a horizontal position by suction. The spin chuck 50 can be moved in vertical directions and can be rotated about a vertical axis by a driving device 51. A guide ring 5 having a sectional shape resembling the inverted letter V is disposed under the spin chuck 50. The guide ring 5 has a vertical, peripheral skirt. The spin chuck 50 and the guide ring 5 are surrounded by a cup 52.

The open upper end of the cup 52 is formed in a size greater than that of the wafer W to enable the spin chuck 50 to move vertically. A gap 5a serving as a drain passage is formed between the side wall of the cup 52 and the skirt of the guide ring 5. A lower part of the cup 52 and the skirt of the guide ring 5 define a labyrinthine passage serving as a gas-liquid separator. Two exhaust ports 53a are formed in radially inner parts of the bottom wall of the cup 52. Exhaust pipes 53 are connected to the exhaust ports 53a, respectively. Two drain ports 54a are formed in radially outer parts of the bottom wall of the cup 52. Drain pipes 54 are connected to the drain ports 54a, respectively. The drain pipes 54 are connected to a recovery pipe 6.

The protective film removing device 40 is provided with a remover pouring nozzle 70 for pouring a remover onto the wafer W to remove a protective film formed on the wafer W. The remover pouring nozzle 70 is connected to a remover source 76 by a remover supply pipe 73. The remover source 76 supplies the remover through the remover supply pipe 73 to the remover pouring nozzle 70. A flow control system 75 including a valve and a flow regulator is incorporated into the remover supply pipe 73. The remover is a fluorocarbon solvent because the protective film is made of a fluorocarbon resin.

Back rinsing nozzles 7a and 7b are disposed under a peripheral part of the wafer W held by the spin chuck 50 to spout the remover against a peripheral part of the lower surface of the wafer W. The back rinsing nozzles 7a and 7b are bent obliquely radially outward to spout the remover obliquely upward. The back rinsing nozzles 7a and 7b have spouting openings formed such that the remover spouted through the back rinsing nozzles 7a and 7b can reach the peripheral part of the back surface of the wafer W radially outward from below the wafer W. The back rinsing nozzles 7a and 7b are connected to one end of a branch pipe branched from the remover supply pipe 73 connected to the remover source 76.

As shown in FIG. 4B, the remover pouring nozzle 70 is connected to a moving mechanism 56 by an L-shaped arm 77. The moving mechanism 56 moves the arm 77 along a guide rail 58 extended longitudinally, i.e., extended in the direction of the arrow Y, in a processing vessel. The arm 77 can be moved from a waiting area 59 outside of one end of the cup 52 toward the other end of the cup 52. The arm 77 can move vertically. As shown in FIG. 4B, an opening 60 is formed in a wall of the processing vessel 57 facing a working space in which the main carrying device 31A works. The wafer W is carried into and carried out of the processing vessel 57 through the opening 60. The opening 60 is covered with a shutter 61.

Figure 5:
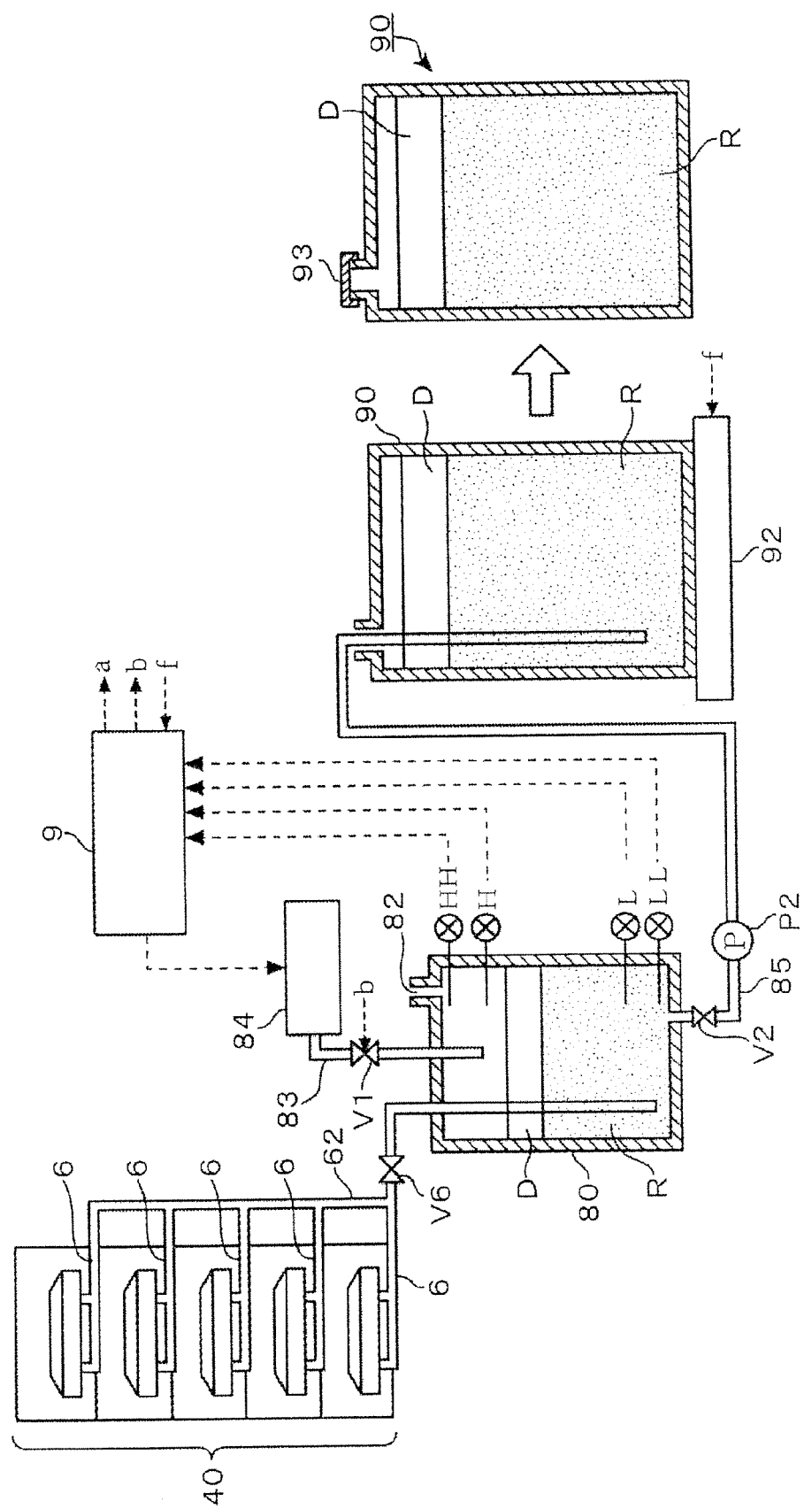
FIG. 5 is a schematic view of assistance in explaining a mixed chemical solution recovering system for recovering a mixed chemical solution discharged from the protective film removing device.

As shown in FIG. 5, the respective downstream ends of the recovery pipes 6 of the protective film removing devices 40 are connected to a common recovery pipe 62. An end part of the common recovery pipe 62 is inserted into an intermediate tank 80 through the top wall of the intermediate tank 80 so as to extend near to the bottom wall of the intermediate tank 80. The intermediate tank 80 is disposed, for example, in a space defined in a bottom part of the interface block B3 and isolated from the first carrying chamber 28a in which the wafer w is carried. The common recovery pipe 62 is provided with a valve V6. In this embodiment, the recovery pipes 6 and the common recovery pipe 62 form a recovery passage.

A vent 82 is formed in the top wall of the intermediate tank 80 in addition to an opening through which the common recovery pipe 62 is inserted into the intermediate tank 80. The interior of the intermediate tank 80 is opened to the atmosphere through the vent 82. A pure water supply pipe 83 is connected to the intermediate tank 80. Pure water D having a specific gravity of 1.0, as a volatilization preventing liquid is supplied into the intermediate tank 80. The volatilization preventing liquid is not limited to pure water and may be any suitable liquid, provided that the liquid has a specific gravity in the range of, for example, 0.7 to 1.5. The pure water supply pipe 83 is connected through a valve V1 to the pure water source 84. The intermediate tank 80 is provided with water level sensors HH, H, L and LL, namely, liquid quantity monitoring means for measuring water levels in the intermediate tank 80. The water level sensor HH senses an emergency upper limit water level for emergency stop. The water level sensor H senses an upper limit water level. The water level sensor L senses a set water level at which the volatilization preventing liquid is contained beforehand in the intermediate tank 80. The water level sensor LL senses a pump stopping water level. A pump P2 for pumping the mixed chemical solution contained in the intermediate tank 80 into a recovery tank 90 is stopped upon the drop of the water level to the pump stopping water level. A transfer pipe 85 forming a transfer passage is connected to the bottom wall of the intermediate tank 80. The transfer pipe 85 is provided with a valve V2 and the pump P2 is connected to the transfer pipe 82. An end part of the transfer pipe 85 is inserted into the recovery tank 90 through the top wall of the recovery tank 90 so as to extend near to the bottom wall of the recovery tank 90.

The recovery tank 90 is mounted on a weight sensor 92, namely, a full-capacity sensing means. Upon the increase of the weight of the recovery tank 90 measured by the weight sensor 92 to a predetermined weight corresponding to the weight of the recovery tank 92 loaded to its maximum capacity, an alarm generator, not shown, generates an alarm and a control panel, not shown, displays an alarm to that effect.

The protective film removing device 40 is provided with a controller 9 holding a computer program for accomplishing a series of operations which will be described later. The controller 9 controls operations including an operation for timing transferring the mixed chemical solution R and the pure water D contained in the intermediate tank 80 to the recovery tank 90. The program is stored in a storage medium, such as a flexible disk (FD), a memory card, a compact disk (CD), a magnetooptical disk (MO) or the like. The program is installed in the controller 9, namely, a computer.

The operation of the preferred embodiment will be described. First, the flow of a wafer W in the coating and developing system will be briefly described. A carrier 2 containing wafers W is delivered from an external device to the stage 20. The lid of the carrier 2 and the opening 21 are opened simultaneously. The transfer device A1 takes a wafer W from the carrier 2. The wafer W is transferred through a transfer unit, not shown, namely, one of the layered devices of the shelf unit U1, to the main carrying device A2. The wafer W is subjected to pretreatment processes, such as a hydrophobicity imparting process and a cooling process, before being subjected to a coating process. Then, the coating unit (COT) 30 coats a surface of the wafer W with a liquid resist. Then, the protective film forming unit (TC) 3 coats a resist film formed on the wafer W with a water-repellent protective film. In other case, the antireflection film forming unit BARC forms an antireflection film on the resist film. In some cases, an antireflection film is formed on the resist film and a protective film is formed on the antireflection film. Then, the wafer W is subjected to a heating process (baking process) and a cooling process by the heating unit (PAB), namely, one of the devices of the shelf units U1 to U3. Then the wafer W is transferred through the transfer unit TRS1 of the shelf unit U3 to the interface block B3. The main carrying device 31A of the interface block B3 carries the wafer W sequentially to the edge exposure device WEE, the buffer cassette SBU and the precision temperature adjusting unit CPL. Then, the auxiliary carrying device 31B carries the wafer W from the precision temperature adjusting unit CPL to the exposure system B4. The exposure system B4 processes the wafer W by an exposure process. Then, the auxiliary carrying device 31B carries the wafer W processed by the exposure process to the transfer unit TRS2. Then, the main carrying device 31A carries the wafer W from the transfer unit TRS2 to the protective film removing device 40.

A protective film removing process to be carried out by the protective film removing device 40 will be briefly described. The protective film removing process removes the water-repellent protective film by dissolving the water-repellent protective film in a remover also called a stripper. The wafer W is rotated, a predetermined quantity of the remover is poured through the remover pouring nozzle 70 onto a central area of the upper surface of the wafer W and, at the same time, a predetermined quantity of the remover is spouted through the back rinsing nozzles 7a and 7b against a peripheral area of the lower surface of the wafer W extending from the circumference to a circle, for example, at 80 mm from the circumference. The remover poured onto the central area of the upper surface of the wafer W spreads toward the circumference dissolving the protective film, and then drips into the gap 5a formed between the side wall of the cup 52 and the skirt of the guide ring 5. The remover spouted against the peripheral area of the lower surface of the wafer W spreads toward the circumference of the wafer W dissolving the protective film coating a peripheral part of the lower surface of the wafer W, and then drips into the gap 5a formed between the side wall of the cup 52 and the skirt of the guide ring 5. A mixed chemical solution of the remover and the protective film dissolved in the remover, having a specific gravity, for example, in the range of 1.7 to 1.8 is drained through the two drain ports 54a formed in the radially outer parts of the bottom wall of the cup 52 into the drain pipes 54. Gases contained in the cup 52 is discharged through the two exhaust ports 53a formed in the radially inner parts of the bottom wall of the cup 52 and the exhaust pipes 53 connected to the exhaust ports 53a by the agency of a suction pump, namely, a sucking means.

After the protective film removing device 40 has completed the protective film removing process, the main carrying device 31A carries the wafer W to the heating unit PEB of the shelf unit U3. Then, the wafer W is subjected to a developing process by the developing unit DEV of the shelf unit U5. The developing process develops the exposed resist film by wetting the surface of the wafer W with a developer to form a resist mask of a predetermined pattern. Then, the transfer device A1 returns the wafer W into the carrier 2 placed on the stage 20.

Figure 6:
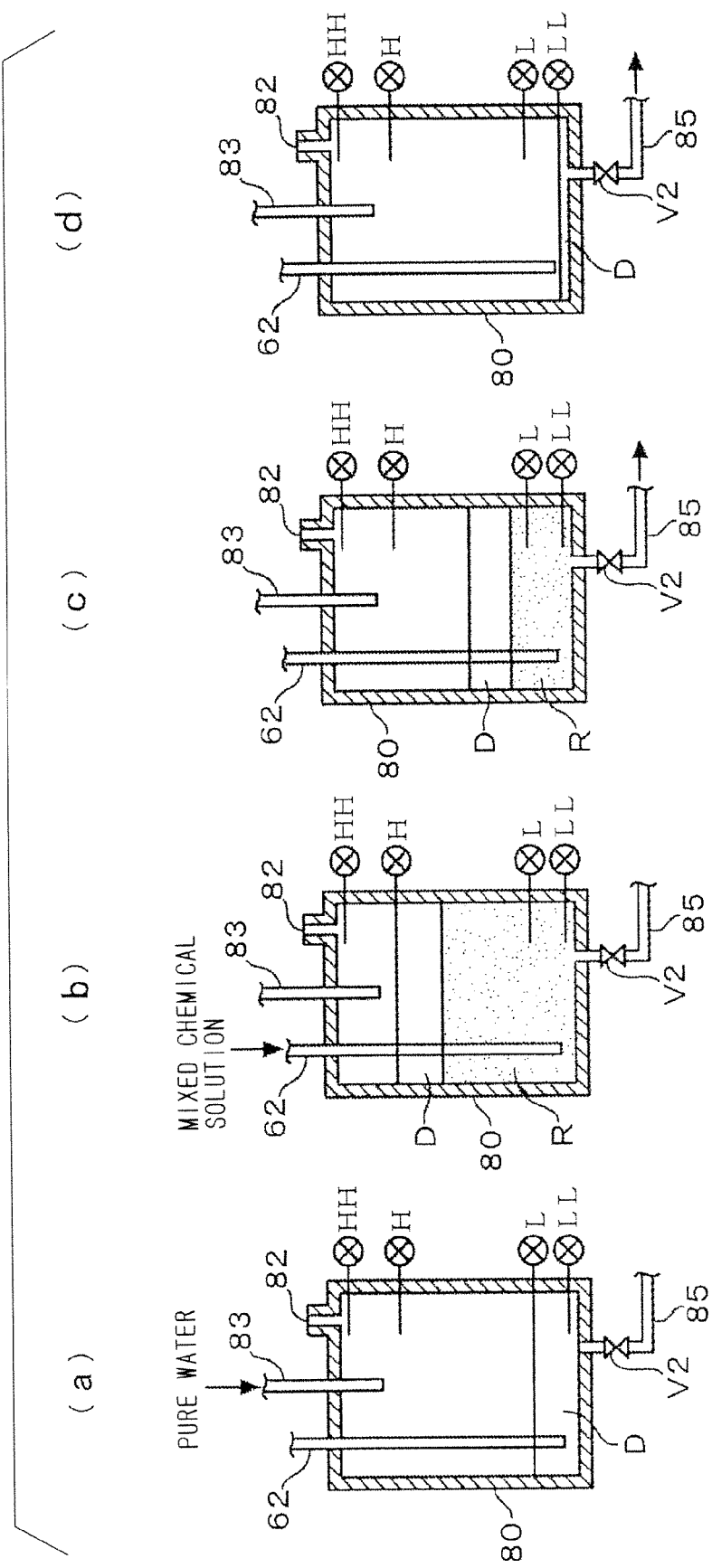
FIGS. 6a, 6B, 6C and 6D are schematic views of assistance in explaining recovering the mixed chemical solution by using an intermediate tank.

A mixed chemical solution recovering process for recovering the mixed chemical solution drained from the protective film removing device 40 will be described with reference to FIGS. 5 and 6. The valve V1 is opened to supply pure water D from the pure water source 84 through the pure water supply pipe 83 into the empty intermediate tank 80. Upon the rise of the surface of the pure water D contained in the intermediate tank 80 to a level corresponding to the water level sensor L as shown in FIG. 6A, the valve V1 is closed to stop supplying pure water D.

Then, the valve V6 is opened to supply the mixed chemical solution R drained from the protective film removing device 40 through the recovery pipe 62 into the intermediate tank 80 containing a predetermined quantity of pure water D. The mixed chemical solution R has a specific gravity greater than that of pure water D and remains separated from the pure water D contained in the intermediate tank 80. Therefore, the layer of the pure water D rises as the quantity of the mixed chemical solution R contained in the intermediate tank 80 increases as shown in FIG. 6B. Upon the rise of the surface of the pure water D contained in the intermediate tank 80 to a level corresponding to the water level sensor H as shown in FIG. 6B, the valve V2 is opened and the pump P2 pumps the mixed chemical solution R contained in a lower part of the intermediate tank 80 through the transfer pipe 85 into the recovery tank 90 as shown in FIG. 6C. The mixed chemical solution R contained in the intermediate tank 80 decreases gradually and, eventually, the pure water D is transferred together with the mixed chemical solution R to the recovery tank 90. Upon the drop of the surface of the pure water D to a level corresponding to the water level sensor LL as shown in FIG. 6D, the valve V2 is closed to stop transferring the mixed chemical solution R and the pure water D to the recovery tank 90.

Then, pure water D is supplied from the pure water source 84 through the pure water supply pipe 83 into the intermediate tank 80 until the surface of the pure water D contained in the intermediate tank 80 rises to a level corresponding to the water level sensor L as shown in FIG. 6A. Thus a cycle of the operations shown in FIGS. 6A to 6D is repeated to fill up the intermediate tank 80 with pure water D and the mixed chemical solution R and to transfer the mixed chemical solution R and the pure water D to the recovery tank 90.

Since the specific gravity of the mixed chemical solution R is greater than that of pure water D, the pure water D is stored in a layer over the layer of the mixed chemical solution R in the recovery tank 90 as shown in FIG. 5. Upon the increase of a weight measured by the weight sensor 92 to a set value, i.e., upon the increase of the quantity of the liquids contained in the recovery tank 90 to the capacity of the recovery tank 90, the weight sensor 92 sends a signal to that effect to the controller 9. Then, an alarm generator, not shown, generates an alarm and the control panel, not shown, displays an alarm to the effect that the recovery tank 90 is full. Upon the recognition of the alarm, an operator, for example, carries the recovery tank 90 to a predetermined position. Then, the opening in the top wall of the recovery tank 90 is covered with a lid 93 so as to seal the recovery tank 90. The thus sealed recovery tank 90 is collected by the trader concerned.

When the protective film removing device 40 in the preferred embodiment removes the water-repellent protective film formed on the surface of the wafer W by dissolving the water-repellent protective film in the remover, namely, a fluorocarbon solvent, and recovers the mixed chemical solution R, which is a mixture of the remover and a solution produced by dissolving the water-repellent protective film in the remover, the mixed chemical solution R is stored temporarily in the intermediate tank 80 with the surface of the mixed chemical solution R covered with pure water D to prevent the volatilization of the mixed chemical solution R. Upon the increase of the quantity of the liquids contained in the intermediate tank 80 to a predetermined set value, the mixed chemical solution R and the pure water D contained in the intermediate tank 80 is transferred to the recovery tank 90. Since the highly volatile mixed chemical solution is covered with pure water D in both the intermediate tank 80 and the recovery tank 90, the mixed chemical solution R can be recovered at a high recovery percentage.

The mixed chemical solution R can be separated from the pure water D by the least work when the mixed chemical solution contained in the tank is taken out and the quantity of the mixed chemical solution R lost by volatilization can be reduced to a minimum, as compared with the quantity of the mixed chemical solution R lost by volatilization when the mixed chemical solution R is collected directly in the recovery tank 90, when the mixed chemical solution R is stored temporarily in the intermediate tank 80.

Figure 7:
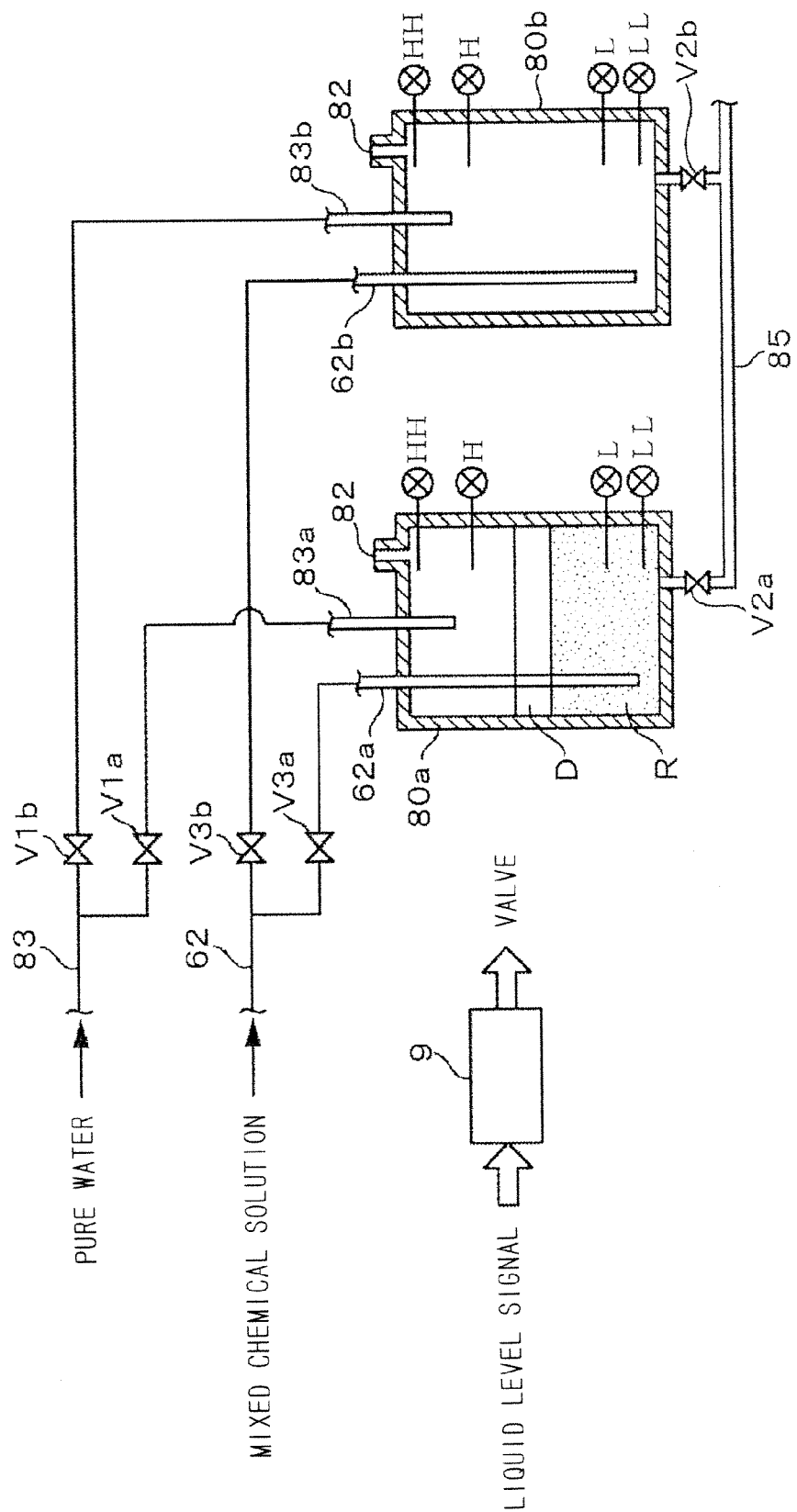
FIG. 7 is a schematic view of an intermediate tank in a modification.

FIG. 7 shows a mixed chemical solution recovering system included in a modification. In the modification shown in FIG. 7, branch recovery pipes 62a and 62b may be branched from the common recovery pipe 62, and branch pure water supply pipes 83a and 83b may be branched from the pure water supply pipe 83, and a first intermediate tank 80a and a second intermediate tank 80b may be used. The branch recovery pipe 62a and the branch pure water supply pipe 83a are inserted into the first intermediate tank 80a. The branch recovery pipe 62b and the branch pure water supply pipe 83b are inserted into the second intermediate tank 80b. The mixed chemical solution R may be delivered to the intermediate tanks 80a and 80b in the following manner. Upon the increase of the quantity of the liquid contained in the first intermediate tank 80a (the second intermediate tank 80b) to a predetermined set value, delivery of the mixed chemical solution R to the first intermediate tank 80a (the second intermediate tank 80b) is stopped and delivery of the mixed chemical solution R to the second intermediate tank 80b (the first intermediate tank 80a) is started.

This modification will be described with reference to FIG. 7. Suppose that a predetermined quantity of pure water D is stored in each of the first intermediate tank 80a and the second intermediate tank 80b. A valve V3a placed in the branch recovery pipe 62a is opened to deliver the mixed chemical solution R into the first intermediate tank 80a. Upon the rise of the surface of the pure water D to a level corresponding to a water level sensor H, the valve V3a is closed, a valve V2a is opened to transfer the mixed chemical solution R contained in the first intermediate tank 80a to a recovery tank 90. At the same time, a valve V3b placed in the branch recovery pipe 62b is opened to deliver the mixed chemical solution R to the second intermediate tank 80b. The valve V3a is closed and the valve V3b is opened upon the increase of the quantity of the liquid contained in the first intermediate chamber 80a to the predetermined set value to deliver the mixed chemical solution R into the second intermediate tank 80b. Thus the mixed chemical solution R can be continuously recovered by alternately using the first intermediate tank 80a and the second intermediate tank 80b.

In the foregoing example, the pure water D is transferred to the recovery tank 90 together with the mixed chemical solution R contained in the intermediate tank 80 when the valve V2 is opened As shown in FIGS. 5 and 6. Only the mixed chemical solution R may be transferred to the recovery tank 90. A method of transferring only the mixed chemical solution R from the intermediate tank 80 to the recovery tank 90 closes the valve V2 as soon as the water level sensor L sensed the surface of the pure water D. If only the mixed chemical solution R is transferred from the intermediate tank 80 to the recovery tank 90, it is preferable to insert a pure water supply pipe connected to the pure water source 84 through an opening formed in the top wall of the recovery tank 90 into the recovery tank 90 and to supply a predetermined quantity of pure water D from the pure water source 84 through the pure water supply pipe into the recovery tank 90 before starting transferring the mixed chemical solution R from the intermediate tank 80 to the recovery tank 90.

Figure 8:
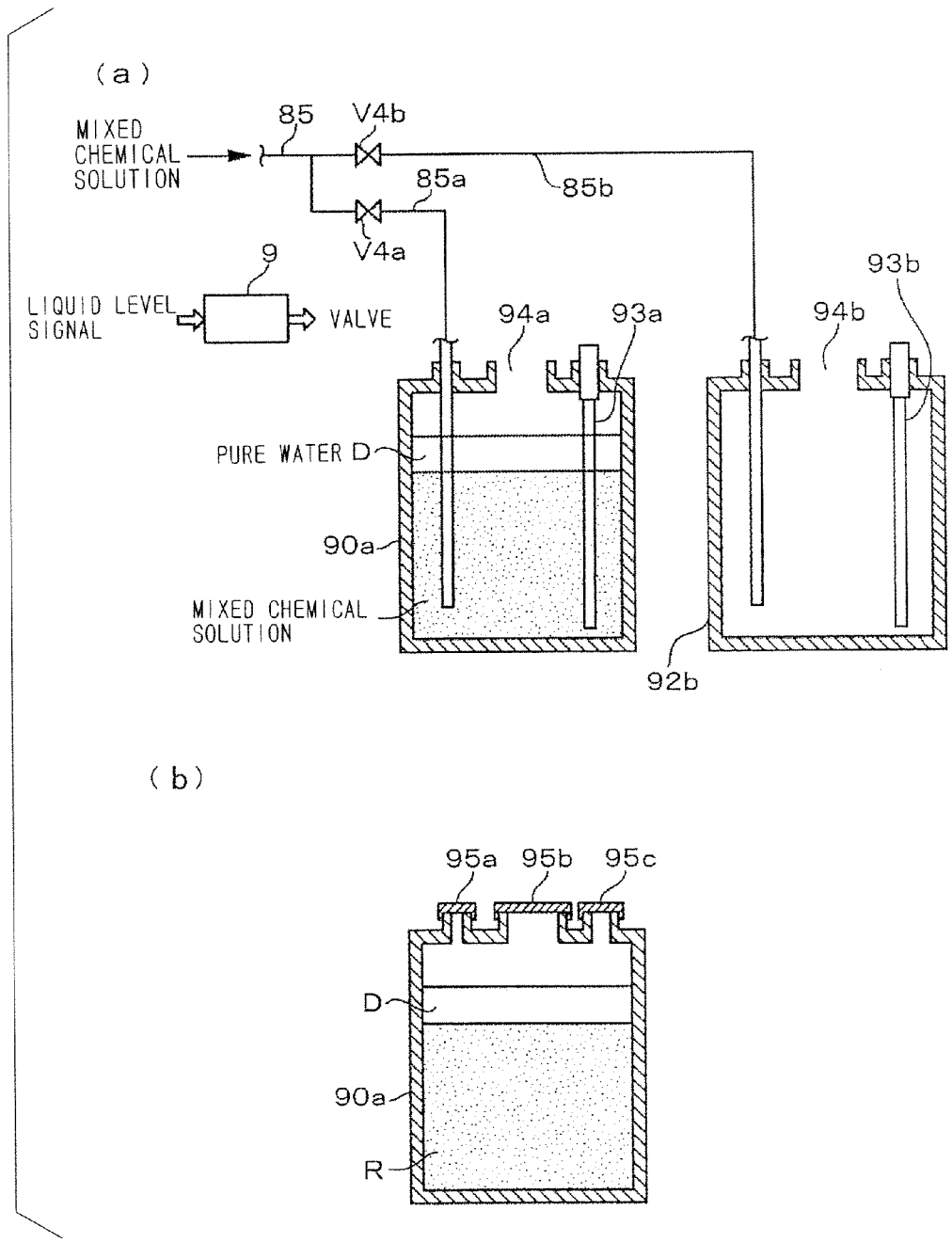
FIGS. 8A and 8B are schematic views of a recovery tank in a modification.

In the foregoing example, the mixed chemical solution R and the pure water D are transferred through the transfer pipe 82 into the single recovery tank 90 and the recovery tank 90 is carried away after the weight of the recovery tank 90 has reached a predetermined weight. As shown in FIG. 8, a first branch transfer pipe 85a and a second branch transfer pipe 85b may be branched from the transfer pipe 85, the first branch transfer pipe 85a and the second branch transfer pipe 85b may be inserted into a first recovery tank 90a and a second recovery tank 90b, respectively, and transfer of the mixed chemical solution R and the pure water D to the first recovery tank 90a (the second recovery tank 90b) may be stopped and transfer of the mixed chemical solution R and the pure water D to the second recovery tank 90b (the first recovery tank 90a) may be started upon the increase of the quantity of the liquid contained in the first recovery tank 90a (the second recovery tank 90b) to a predetermined set value.

An example using the two recovery tanks 90a and 90b will be described with reference to FIG. 8. Water level sensing units 93a and 93b are inserted into the first recovery tank 90a and the second recovery tank 90b, respectively. Each of the water level sensing units 93a and 93b are provided with water level sensors HH, H, L and LL arranged in that order as mentioned above with reference to FIGS. 5 and 6. First, a valve V4a placed in the first branch transfer pipe 85a is opened to transfer the mixed chemical solution R and the pure water D sequentially from the intermediate tank 90 to the first recovery tank 90a. Upon the rise of the surface of the pure liquid D to a level corresponding to the water level sensor H, the valve V4a is closed and a valve V4b placed in the second branch transfer pipe 85b is opened to transfer the mixed chemical solution R and the pure water D to the second recovery tank 90b. Then, as shown in FIG. 8B, the first transfer 85a and the water level sensing unit 93a inserted through openings formed in the top wall of the first recovery tank 90a are removed. Then, those openings and an outlet 94a formed in the top wall of the first recovery tank 90a are covered with lids 95a, 95b and 95c, respectively, and the first recovery tank 90a is collected by the trader concerned. The valve V4a is closed and the valve V4b is opened upon the increase of the quantity of the liquid contained in the first recovery tank 90a to a predetermined set quantity to stop transferring the mixed chemical solution R and the pure water D to the first recovery tank 90a and to start transferring the mixed chemical solution R and the pure water D to the second recovery tank 90b. Thus the mixed chemical solution R can be continuously recovered by using the first recovery tank 90a and the second recovery tank 90b alternately. In this example, the water level sensing units 90a and 90b are full capacity sensing means. Weight sensors may be used instead of the water level sensing units 93a and 93b for sensing the respective quantities of liquids contained respectively in the recovery tanks 90a and 90b. The valve V4a (V4b) is opened and the valve V4b (V4a) is closed when a measured value measured by the weight sensor coincides with a set value. Possible full capacity sensing means other than the weight sensor and the water level sensor are, for example, a capacitance type level gage provided with an electrode placed in the recovery tank 90 and capable of sending out a signal requesting stopping transferring the mixed chemical solution R and the pure water D to the recovery tank 90 when the electrode is immersed in the mixed chemical solution R, and a photoelectric level gage provided with a light-emitting diode that emits light of a fixed intensity into the recovery tank 90 and a photodiode that receives light reflected from the surface of the pure water D, which are placed in the recovery tank 90 and capable of sending out a signal requesting stopping transferring the mixed chemical solution R and the pure water D to the recovery tank 90 when the photodiode receives light of a predetermined intensity.

The transfer of the mixed chemical solution R and the pure water D from the intermediate tank 80 to the recovery tank 90 may be controlled by any suitable method other than the method using the water level sensors HH, H, L and LL. A possible method of controlling the transfer of the mixed chemical solution R and the pure water D from the intermediate tank 80 to the recovery tank 90 will be described by way of example. First, pure water D is supplied from the pure water source 84 through the pure water supply pipe 83 into the intermediate tank 80. The quantity of pure water D to be supplied into the intermediate tank 80 is controlled by controlling the duration of the open state of the valve V1 placed in the pure water supply pipe 83. Subsequently, the operation of the protective film removing devices 40 is started. The quantity v of the remover to be spouted through the remover pouring nozzle 70 of each protective film removing device 40 is known. The controller 9 counts the total number N of operations of the remover pouring nozzles 70. The total number N is one when any one of the protective film removing devices 40 carries out one protective film removing cycle. For example, if the first protective film removing device 40 carries out one protective film removing cycle and the second protective film removing device 40 carries out two protective film removing cycles, the total number N is four. It is decided that the intermediate tank 80 is full when N×v ≧ set value. When the intermediate tank 80 becomes full, the valve V2 is opened and the pump P2 is operated to transfer the mixed chemical solution R and the pure water D contained in the intermediate tank 80 through the transfer pipe 85 into the recovery tank 90. A program including instructions for controlling the valve V2 for opening and closing on the basis of the number of total protective film removing cycles carried out by the protective film removing devices 40 is stored in a storage device included in the controller 9.

Figure 9:
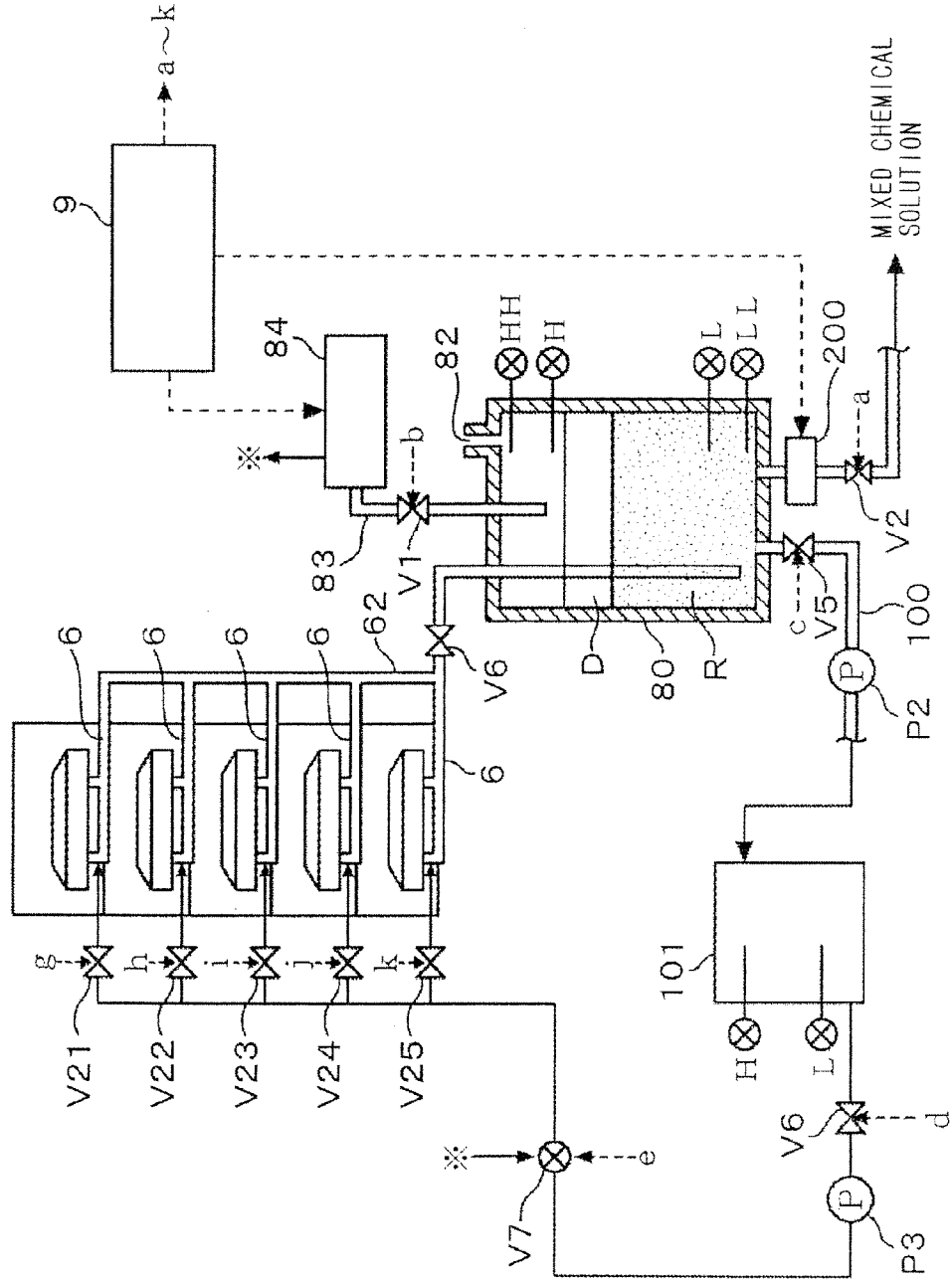
FIG. 9 is a schematic view of another mixed chemical solution recovering system for recovering a mixed chemical solution discharged from the protective film removing device.

An arrangement shown in FIG. 9 is also possible. Referring to FIG. 9, an interface detector (liquid change sensing means) 200, such as a gravity meter capable of measuring the specific gravity of a liquid or a measuring instrument capable of measuring the refractive index of a liquid, is placed in the transfer pipe 85 connected to the bottom wall of the intermediate tank 80, and the valve V2 is closed upon the detection of a change of the liquid from the mixed chemical solution R to the pure water D by the interface detector 200 to transfer only the mixed chemical solution R to the recovery tank 90. It is preferable to supply a predetermined quantity of pure water D into the recovery tank 90 from the pure water source 84 through the pure water supply pipe by opening the valve placed in the pure water supply pipe before starting transferring the mixed chemical solution R from the intermediate tank 80 to the recovery tank 90.

Preferably, intermediate tank 80 is provided with water level sensors L, H and HH to monitor liquid level in the intermediate tank 80 also when the foregoing method is employed.

A drain pipe, not shown, provided with a pump may be connected to the bottom wall of the intermediate tank 80, and the pure water D contained in the intermediate tank 80 may be discharged by closing the valve V2 of the transfer pipe 85 and operating the pump placed in the drain pipe when the interface detector 200 detects the interface between the mixed chemical solution R and the pure water D or the coincidence of the level of the surface of the pure water D contained in the intermediate tank 80 with the water level sensor L or LL. When the pure water D is discharged in such a method, a predetermined quantity of fresh pure water D is contained always in the intermediate tank 80 before the mixed chemical solution R is supplied into the intermediate tank 80, which suppresses the volatilization of the mixed chemical solution R more effectively.

An arrangement shown in FIG. 9 is possible. Referring to FIG. 9, a return pipe 100 is connected to the bottom wall of the intermediate tank 80, a return tank 101 is connected to the return pipe 100, the return pipe 100 extending on the downstream side of the return tank 101 is connected to upstream parts of the recovery pipes 6 through valves V21 to V25, and a pump P3 is placed in the return pipe 100 extending on the downstream side of the return tank 101. Thus the used pure water D may be pumped into the recovery pipes 6 by opening the valves V21 to V25 and operating the pump P3 to push the mixed chemical solution R and the pure water D recovered from the protective film removing devices 40.

This arrangement will be described with reference to FIG. 9. The valve V2 is closed and the valves V5 and V1 are opened when the interface detector 200 detects the interface between the mixed chemical solution R and the pure water D or the coincidence of the level of the surface of the pure water D contained in the intermediate tank 80 with the water level sensor L or LL to supply the used pure water D remaining in the intermediate tank 80 and pure water D supplied from the pure water source 84 into the intermediate tank 80 for a set time. Then, supply of pure water from the pure water source 84 is stopped, the valve V5 is closed if pure water is dripping naturally, and the pump P2 is stopped. An upper limit water level sensor H and a lower limit water level sensor L are placed in the return tank 101. Upon the coincidence of the surface of the pure water D contained in the return tank 101 with a level corresponding to the upper limit water level sensor H, the valves V1 and V5 are closed. This operation is carried out to replace the used pure water D contained in the intermediate tank 80 with fresh pure water D and to store the used pure water D as chasing water in the return tank 101.

When any one of the protective film removing devices 40 completes the protective film removing process, one of the valves V21 to V25 placed in the return pipe 100 connected to this protective film removing device 40 that has completed the protective film removing process and the valve V6 are opened, and the pump P3 placed in the return pipe 100 on the downstream side of the return tank 101 is operated to supply the used pure water D contained in the return tank 101 as chasing water into the recovery pipe 6. The quantity of the used pure water D supplied as chasing water into the return pipe 6 is determined such that the mixed chemical solution R remaining in the recovery pipe 6 can be rinsed off the recovery tank 6 by the used pure water D and can be collected in the intermediate tank 80. More specifically, the quantity of the used pure water D to be supplied from the return tank 101 into the recovery pipe 6 is, for example, on the order of 100 ml and time for which the used pure water D is supplied into the recovery pipe 6 is, for example on the order of 3 s. Thus the mixed chemical solution R discharged from the recovery pipe 6 connected to the protective film removing device can be smoothly transferred to the intermediate tank 80 and the consumption of pure water can be reduced.

In the foregoing example, a three-way valve V7 may be placed in the return pipe 100 extending on the downstream side of the return tank 101 and a pure water supply pipe connected to the pure water source 84 may be connected to the three-way pipe V7. When any one of the protective film removing devices 40 completes the protective film removing process, one of the valves V21 to V25 placed in the return pipe 100 connected to this protective film removing device 40 that has completed the protective film removing process and the three-way valve V7 is operated to select the pure water supply pipe connected to the pure water source 84 to supply fresh pure water D from the pure water source 84 as chasing water into the recovery pipe 6.

The return pipe 100 extending on the downstream side of the return tank 101 is not necessarily connected to the recovery pipes 6 and may be connected to the respective side walls of the cups 52. Work for supplying a predetermined quantity of pure water D into the intermediate tank 80 in advance such that the surface of the pure water D is at a level corresponding to the water level sensor L may be achieved by supplying pure water D through the return pipe 100 extending on the downstream side of the return tank 101 and the recovery pipe 6.

Figure 4:
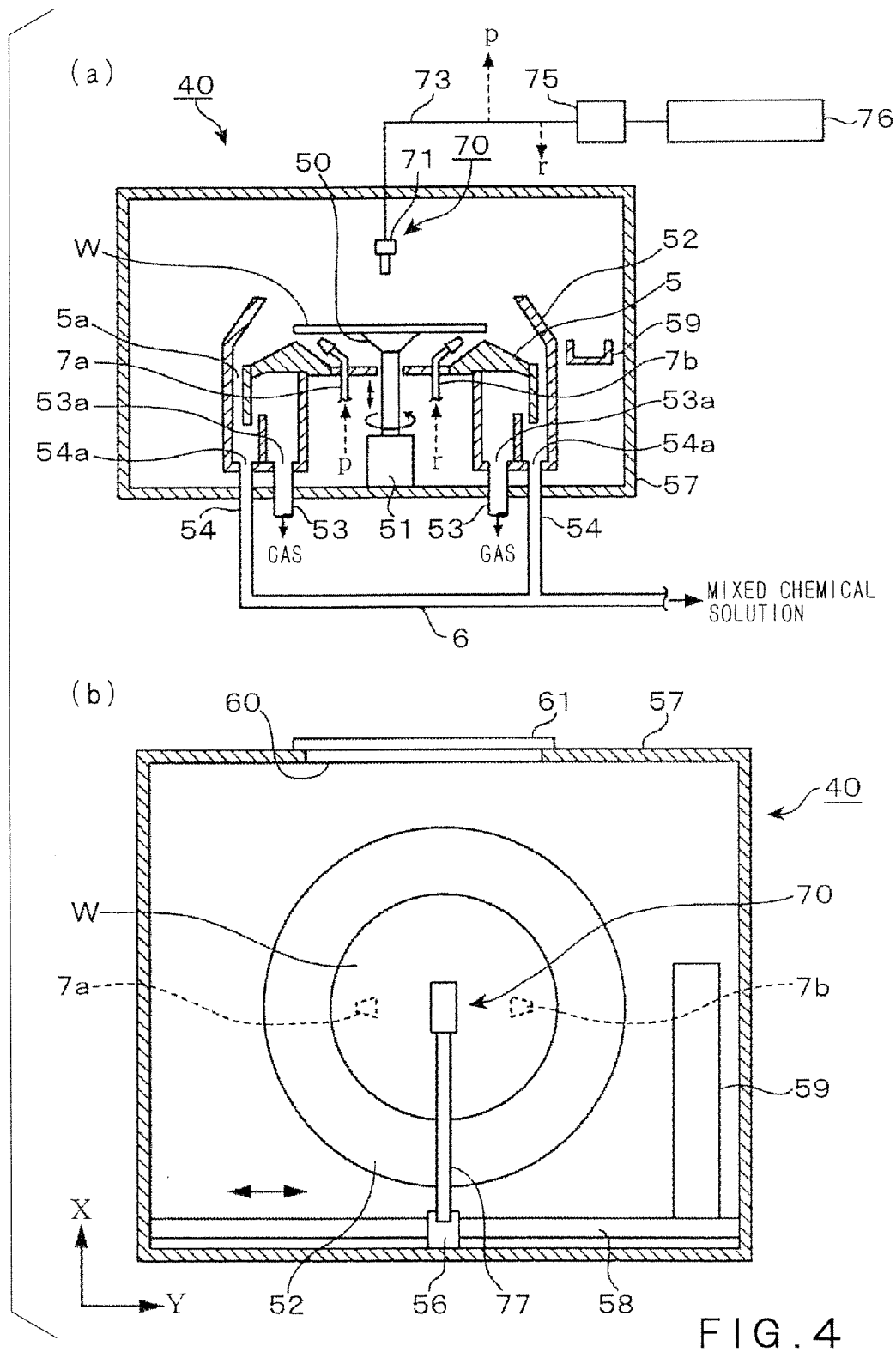
FIGS. 4A and 4B are a schematic sectional view and a schematic front elevation, respectively, of a protective film removing device installed in the interface block.
Figure 10:
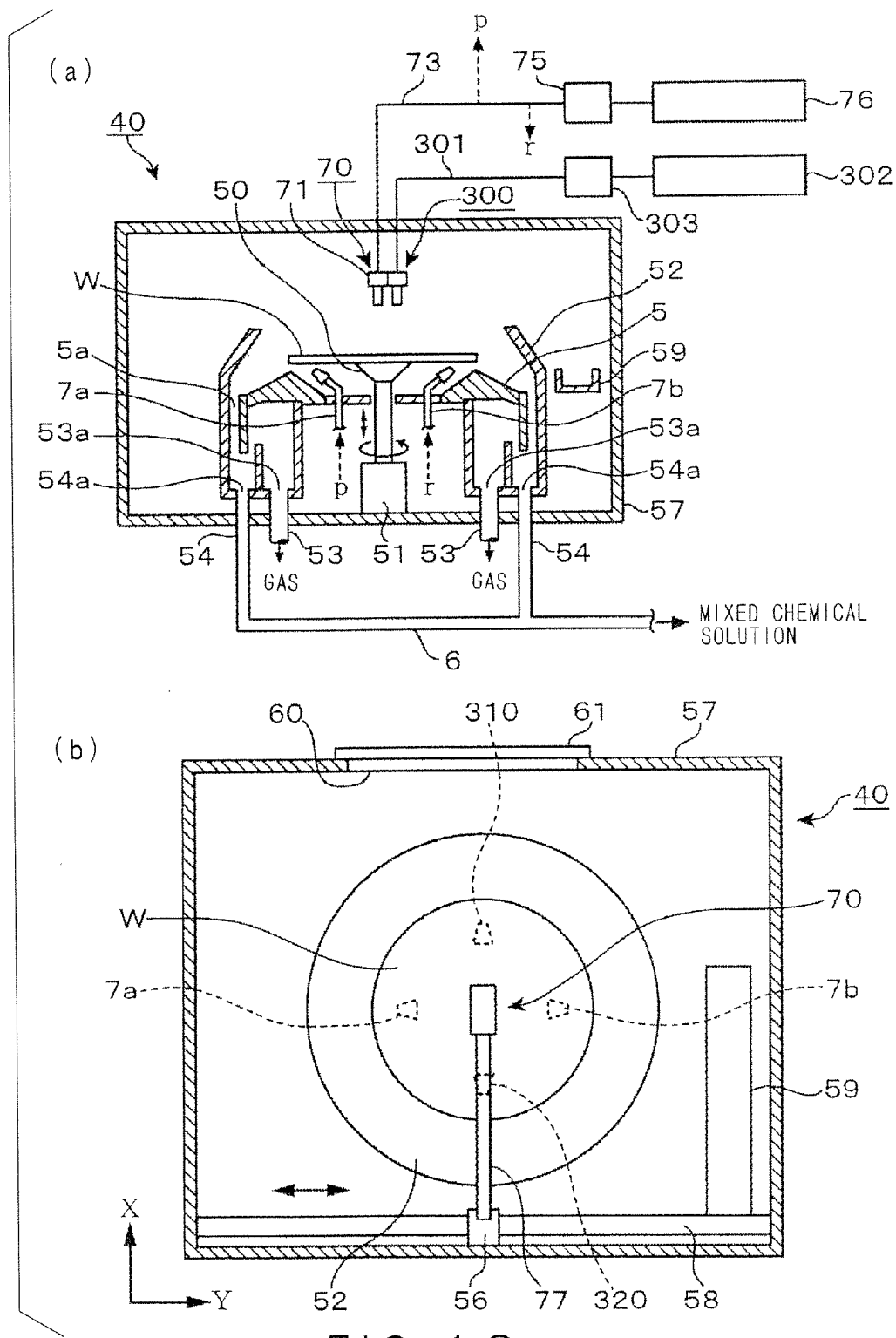
FIGS. 10A and 10B are a schematic sectional view and a schematic front elevation, respectively, of another protective film removing device installed in the interface block.

This example will be described with reference to FIG. 10, in which parts like or corresponding to those of the protective film removing device 40 described with reference to FIG. 4 are designated by the same reference characters. Referring to FIG. 10, a pure water pouring nozzle 300 is joined to a side surface of a remover pouring nozzle 70. The pure water pouring nozzle 300 is connected to a pure water source 302 by a pure water supply pipe 301. A flow control system 303 including a valve and a flow regulator is incorporated into the pure water supply pipe 301. As shown in FIG. 10B, back rinsing nozzles 310 and 320 are disposed under a peripheral part of a wafer W held by a spin chuck 50 to spout pure water against a peripheral part of the lower surface of the wafer W. The back rinsing nozzles 310 and 320 are bent obliquely radially outward to spout pure water obliquely upward. The back rinsing nozzles 310 and 320 have spouting openings formed such that pure water spouted through the back rinsing nozzles 310 and 320 can reach the peripheral part of the back surface of the wafer W radially outward from below the wafer W. The back rinsing nozzles 310 and 320 are connected to one end of a branch pipe branched from the pure water supply pipe 301 connected to the pure water source 302.

In this example, a rinsing process for rinsing the surface of the wafer W with pure water is carried out after the completion of a protective film removing process for removing a protective film formed on the surface of the wafer W. For example, the wafer W is rotated and, at the same time, a predetermined quantity of pure water is poured for, for example, about 5 s onto a central part of the surface of the wafer W through the pure water pouring nozzle 300. The predetermined quantity of pure water is on the order of 100 ml. The pure water D poured onto the central part of the surface of the wafer W spreads toward the circumference of the wafer W, and then drips into a gap 5a formed between the side wall of a cup 52 and the skirt of a guide ring 5. The pure water is drained through two drain ports 54a formed in radially outer parts of the bottom wall of the cup 52 into recovery pipes 54. The quantity of pure water D for a back rinsing process may be determined such that pure water D can satisfactorily rinse the lower surface of the wafer W and can serve also as chasing water to discharge the mixed chemical solution R smoothly from the cup 52 and the recovery pipe 6. Then, the wafer W is rotated at a high rotating speed to dry the surfaces of the wafer W by spin drying. Pure water D drips into the gap 5a between the side wall of the cup 52 and the skirt of the guide ring 5 during the spin drying of the wafer W. The pure water D drained from the protective film removing device 40 flows through a common recovery pipe 62 to an empty intermediate tank 80.

Although pure water D is poured onto the surface of the wafer W through the pure water pouring nozzle 300 disposed beside the remover pouring nozzle 70 in this example, pure water D may be poured by another method. A selecting device for selecting either of the mixed chemical solution R and pure water D may be combined with the remover pouring nozzle 70, and the controller 9 may control the selecting device to spout pure water D through the remover pouring nozzle 70.

In the protective film removing device 40 shown in FIG. 4, annular grooves may be formed in an upper part of the side wall of the cup 52 and the ridge of the protruding part of the guide ring 5, respectively, and a predetermined quantity of pure water may be discharged through the annular grooves into the cup 52 to clean the interior of the cup 52 and the used pure water may be collected in the intermediate tank 80.

Figure 11:
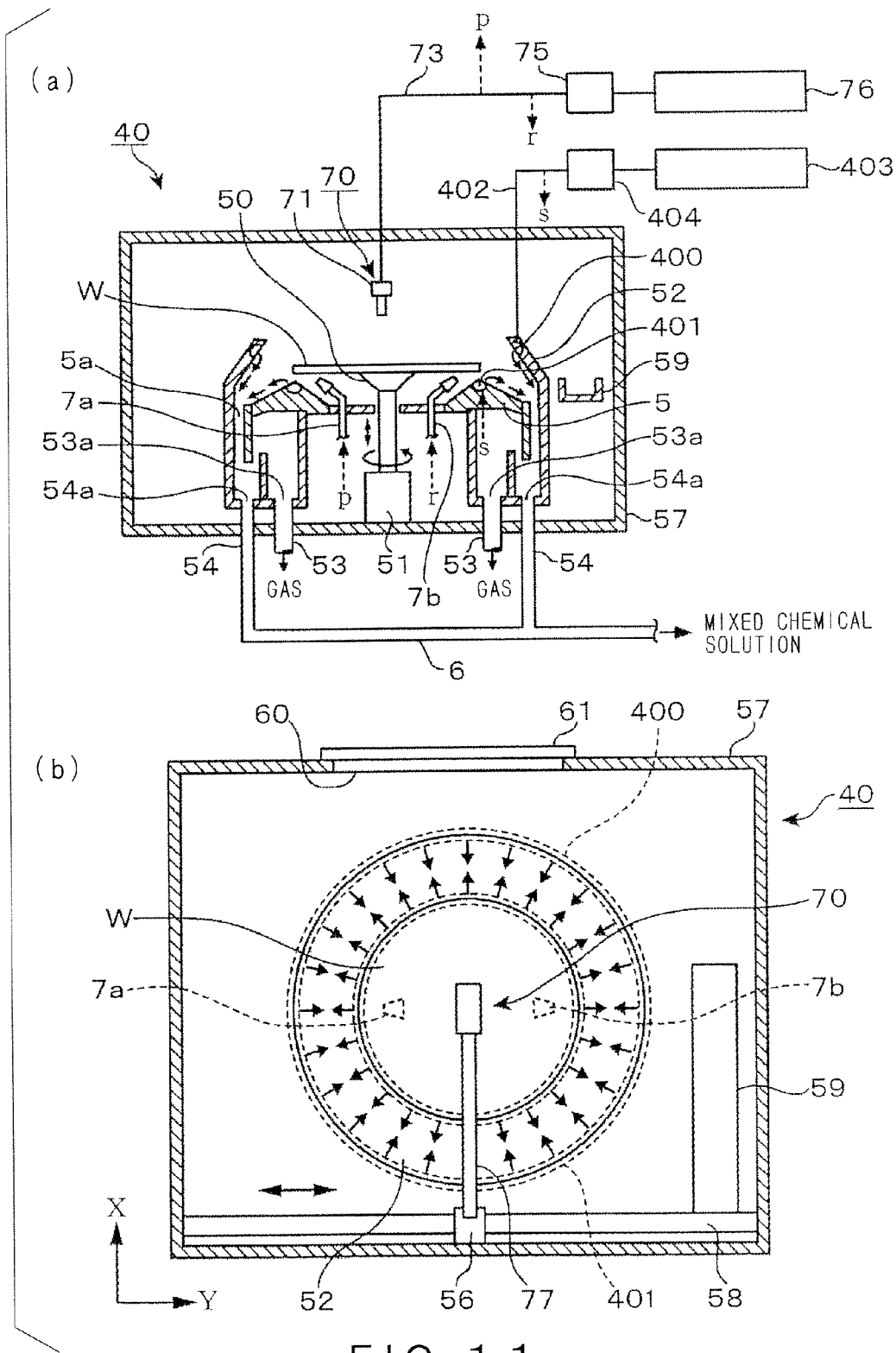
FIGS. 11A and 11B are a schematic sectional view and a schematic front elevation, respectively, of a third protective film removing device installed in the interface block.

This example will be described with reference to FIG. 11, in which parts like or corresponding to those of the protective film removing device 40 described with reference to FIG. 4 are designated by the same reference characters. Referring to FIG. 11, an annular groove 400 is formed in an upper part of the side wall of a cup 52, and an annular groove 401 is formed in the ridge of a protruding part of a guide ring 5. The annular grooves 400 and 401 are connected to a pure water source 403 by a pure water supply pipe 402. A flow control system 404 including a valve and a flow regulator is incorporated into the pure water supply pipe 402. As shown in FIG. 11B, a plurality of discharge ports of, for example, 1 mm in diameter are arranged circumferentially on the bottom surface of the annular groove 400, and a plurality of discharge ports of, for example, 1 mm in diameter are arranged circumferentially on the bottom surface of the annular groove 401. Pure water is discharged through the discharge ports in water curtains into the cup 52 to rinse off a mixed chemical solution wetting the inside surface of the cup 52 and the circumference of the guide ring 5.

Pure water D discharged from the annular groove 400 flows down together with the mixed chemical solution R along the inside surface of the cup 52. Pure water D discharged from the annular groove 401 drips down together with the mixed chemical solution R from the outer edge of guide ring 5. The pure water D and the mixed chemical solution R drained from the protective film removing device 40 flow through a common recovery pipe 62 into an intermediate tank 80. The quantity of pure water D to be discharged from the annular grooves 400 and 401 may be determined so that the pure water can be used also as chasing water.

Figure 12:
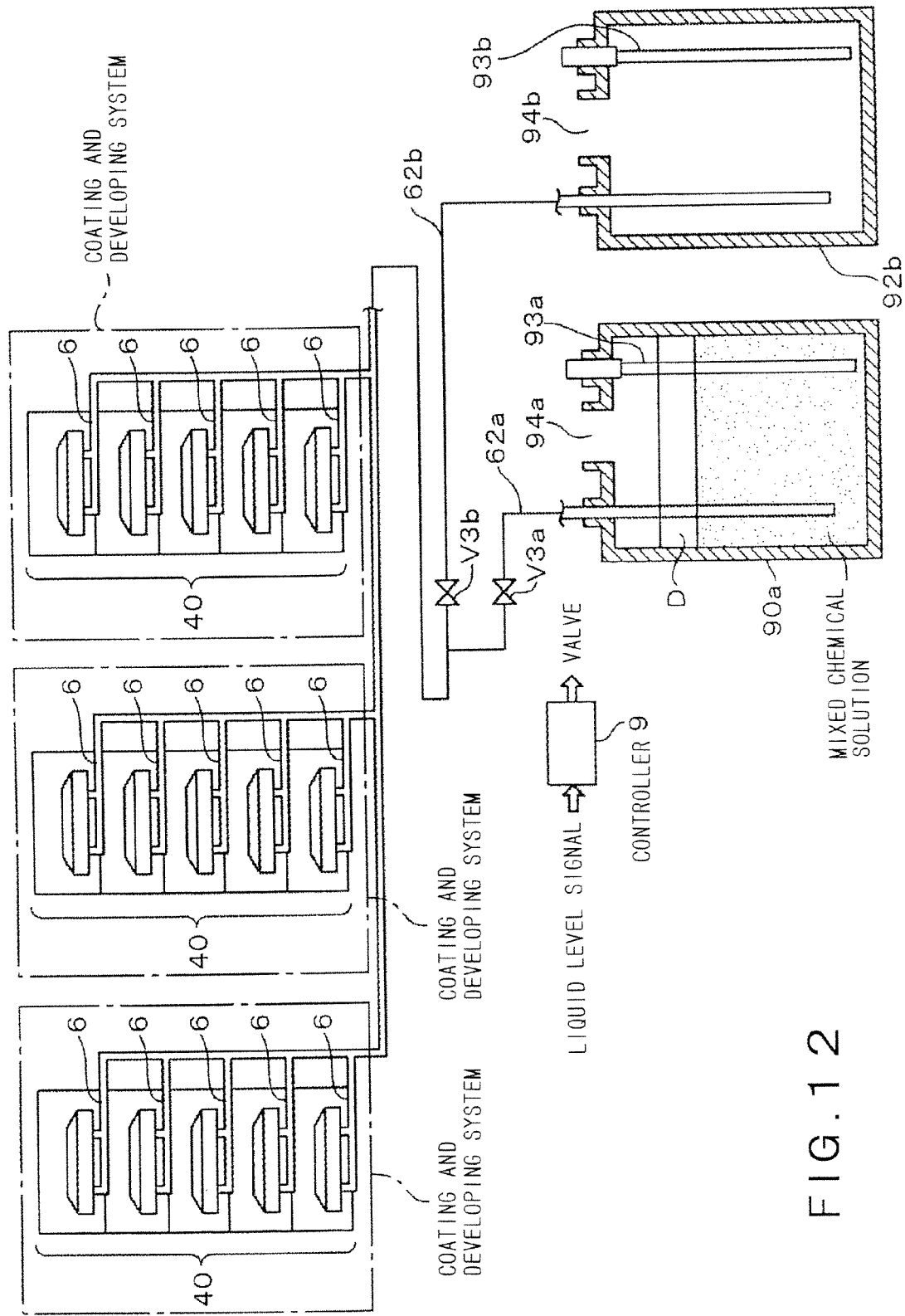
FIG. 12 is a schematic view of assistance in explaining another mixed chemical solution recovering system for recovering a mixed chemical solution discharged from the protective film removing device.

As shown in FIG. 12, a plurality of coating and developing systems may be installed in a plant, and the mixed chemical solution drained from a plurality of protective film removing devices 40 included in each of the coating and developing systems may be delivered directly to a recovery tank 94 installed in the plant through a common recovery pipe 62. When the mixed chemical solution is thus collected, a pure water pouring nozzle 300 is joined to the side surface of a remover pouring nozzle 70 in each protective film removing device 40. A predetermined quantity of pure water D poured through the pure water pouring nozzle 300 is supplied into a recovery tank 90. The surface of the predetermined quantity of pure water D in the recover tank 90 is at a level corresponding to a water level sensor L. Techniques applied to the foregoing embodiment including the intermediate tank 80 and applicable to the arrangement shown in FIG. 12 may be used. For example, as mentioned above with reference to FIG. 8, a first branch recovery pipe 62a and a second branch recovery pipe 62b may be branched from the common recovery pipe 62, the first branch recovery pipe 62a and the second branch recovery pipe 62b may be inserted into a first recovery tank 90a and a second recovery tank 90b, respectively, and transfer of the mixed chemical solution R and the pure water D to the first recovery tank 90a (the second recovery tank 90b) may be stopped and transfer of the mixed chemical solution R and the pure water D to the second recovery tank 90b (the first recovery tank 90a) may be started upon the increase of the quantity of the liquid contained in the first recovery tank 90a (the second recovery tank 90b) to a predetermined set value. A pure water supply pipe connected to a pure water source may be connected to the top wall of the recovery tank 90 to supply pure water D through the pure water supply pipe into the recovery tank 90. A method using the weight sensor, namely, a full-capacity detecting means, for deciding that the recovery tank 90 is full and a method of supplying chasing water through the remover pouring nozzle 70, the pure water pouring nozzle 300 or a pipe connected to the side wall of the cup 52, and through the cup 52 into the recovery pipe 6 may be used.

What is claimed is:

1. A protective film removing device that pours a remover through a remover pouring nozzle onto a surface of a substrate horizontally held by a substrate holding device to remove a water-repellent protective film formed on a surface of a resist film formed on the substrate before subjecting the resist film to immersion exposure by dissolving the water-repellent protective film in the remover after immersion exposure, said protective film removing device comprising:

a recovery line communicating with an atmosphere surrounding the substrate to recover a mixed chemical solution containing the remover, and a chemical solution containing the remover and the water-repellent protective film dissolved in the remover;
an intermediate tank connected to an outlet end of the recovery line;
a volatilization preventing liquid storing device connected to the intermediate tank to provide a volatilization preventing liquid having a specific gravity smaller than that of the mixed chemical solution in the intermediate tank;
a transfer line having an inlet end connected to a lower portion of the intermediate tank and provided with a valve, the lower portion being positioned to communicate with the mixed chemical solution contained in the intermediate tank;
a recovery tank connected to an outlet end of the transfer line;
a liquid quantity monitoring device configured to monitor a quantity of a liquid contained in the intermediate tank;
a controller configured to direct the volatilization preventing liquid storing device to provide the volatilization preventing liquid in the intermediate tank prior to the mixed chemical solution being provided in the intermediate tank via the recovery line based on a signal provided by the liquid quantity monitoring device, the controller further configured to open the valve of the transfer line to transfer the liquid contained in the intermediate tank to the recovery tank when the quantity of the liquid contained in the intermediate tank reaches a predetermined quantity on the basis of a signal provided by the liquid quantity monitoring device; and
a remover pouring nozzle supply device configured to supply the volatilization preventing liquid to the remover pouring nozzle.

2. The protective film removing device according to claim 1, wherein
the intermediate tank includes a first intermediate tank and a second intermediate tank,
the recovery line is branched into at least one first branch line having an outlet end and at least one second branch line having an outlet end, the outlet end of the at least one first branch line and the outlet end of the at least one second branch line being connected to the first intermediate tank and the second intermediate tank, respectively, and
the controller is configured to control a valve of the recovery line such that, when the quantity of the liquid contained in either of the first intermediate tank or the second intermediate tank has reached the predetermined quantity, the recovery line directs the liquid to the other of the first intermediate tank or the second intermediate tank that has not reached the predetermined quantity.

3. The protective film removing device according to claim 2, further comprising a recovery tank supply line that supplies the volatilization preventing liquid into the recovery tank,
wherein the controller is configured to open the valve of the transfer line connected to the intermediate tank when the quantity of the liquid contained in the intermediate tank reaches the predetermined quantity to transfer the liquid from the intermediate tank to the recovery tank.

4. The protective film removing device according to claim 1, wherein the recovery tank includes a first recovery tank and a second recovery tank connected to the outlet end of the transfer line, and
the controller is configured to control the valve of the transfer line such that, when the quantity of the liquid contained in either of the first recovery tank or the second recovery tank has reached a predetermined quantity, the transfer pipe transfers the liquid to the other of the first recovery tank or the second recovery tank that has not reached the predetermined quantity.

5. The protective film removing device according to claim 1, further comprising a liquid change detector capable of sensing a change of the liquid being transferred from the intermediate tank to the recovery tank from the mixed chemical solution to the volatilization preventing liquid,
wherein the controller is configured to close the valve of the transfer line when the change of the liquid from the mixed chemical solution to the volatilization preventing liquid is sensed by the liquid change detector.

6. The protective film removing device according to claim 5, further comprising a drain line through which a liquid contained in the intermediate tank is drained, and a valve placed in the drain line;
wherein the controller is configured to open the valve of the drain line when the change of the liquid from the mixed chemical solution to the volatilization preventing liquid is sensed by the liquid change detector, the controller also configured to close the valve of the transfer line.

7. The protective film removing device according to claim 5, further comprising a return line for returning the liquid contained in the intermediate tank into the recovery line, a valve placed in the return line, and a return tank connected to the return line to contain the volatilization preventing liquid;
wherein the controller is configured to open the valve of the return line to transfer the volatilization preventing liquid to the return tank, the controller also configured to close the valve of the transfer line when the change of the liquid from the mixed chemical solution to the volatilization preventing liquid is sensed by the liquid change detector.

8. The protective film removing device according to claim 1, further comprising a recovery line supply device that supplies the volatilization preventing liquid into the recovery line to rinse off the mixed chemical solution remaining in the recovery line.

9. The protective film removing device according to claim 8, wherein the recovery line supply device that supplies the volatilization preventing liquid into the recovery line includes
a nozzle through which the volatilization preventing liquid is poured onto the surface of the substrate held by the substrate holding device,
nozzles that clean a peripheral part of a back surface of the substrate, or
a volatilization preventing liquid supply line connected to a cup surrounding the substrate holding device and having a bottom wall to which the recovery line is connected.

10. The protective film removing device according to claim 1, wherein, because the volatilization preventing liquid has a specific gravity smaller than that of the mixed chemical solution, the volatilization preventing liquid and the mixed chemical solution remain separated when combined in the intermediate tank, such that the volatilization preventing liquid is located above the mixed chemical solution in the intermediate tank.

11. The protective film removing device according to claim 1, wherein the liquid quantity monitoring device includes a plurality of liquid level sensors that sense the quantity of liquid contained in the intermediate tank, and the controller is configured to open and close the valve of the transfer line based on input from the plurality of the liquid level sensors.

12. The protective film removing device according to claim 2, wherein
the valve of the recovery line comprises a first valve located on the at least one first branch line and a second valve located on the at least one second branch line, and the controller is configured to control the first valve and the second valve such that, when the quantity of the liquid contained in either of the first intermediate tank or the second intermediate tank has reached the predetermined quantity, the first valve and second valve are accordingly regulated by the controller to direct the liquid to the other of the first intermediate tank or the second intermediate tank that has not reached the predetermined quantity.

* * * * *